(12) United States Patent
Lin

(10) Patent No.: US 7,508,660 B2
(45) Date of Patent: Mar. 24, 2009

(54) FIXING MECHANISM

(75) Inventor: Linger Lin, Taipei (TW)

(73) Assignee: Inventec Corporation (TW)

( * ) Notice: Subject to any disclaimer, the term of this patent is extended or adjusted under 35 U.S.C. 154(b) by 229 days.

(21) Appl. No.: 11/702,927

(22) Filed: Feb. 5, 2007

(65) Prior Publication Data

US 2007/0285885 A1    Dec. 13, 2007

(30) Foreign Application Priority Data

Jun. 7, 2006    (TW) ............................. 95209910 U

(51) Int. Cl.
*G06F 1/16*    (2006.01)

(52) U.S. Cl. ................................... 361/685

(58) Field of Classification Search ................. 361/685
See application file for complete search history.

(56) References Cited

U.S. PATENT DOCUMENTS

| | | | |
|---|---|---|---|
| 6,351,378 B1* | 2/2002 | Chao et al. ................... | 361/685 |
| 6,657,868 B1* | 12/2003 | Hsue .......................... | 361/685 |
| 6,954,940 B2* | 10/2005 | Hsu ........................... | 361/685 |
| 7,204,469 B2* | 4/2007 | Chen et al. .................. | 361/685 |
| 7,369,403 B2* | 5/2008 | Chen et al. .................. | 361/685 |
| 2005/0157463 A1* | 7/2005 | Hsu ........................... | 361/685 |
| 2005/0280983 A1* | 12/2005 | Wang et al. .................. | 361/685 |
| 2006/0139871 A1* | 6/2006 | Chen et al. .................. | 361/685 |
| 2007/0019377 A1* | 1/2007 | Chen et al. .................. | 361/685 |

* cited by examiner

*Primary Examiner*—Lisa Lea-Edmonds
(74) *Attorney, Agent, or Firm*—Peter F. Corless; Steven M. Jensen; Edwards Angell Palmer & Dodge LLP

(57) ABSTRACT

A fixing mechanism used for fixing a data accessing device with a plurality of positioning holes to a housing of an electronic device includes a base plate and a positioning member. The base plate has a first fixing portion and a plurality of guiding portions. The positioning member has a plurality of positioning portions, a second fixing portion and a plurality of guiding slots. By moving the guiding portions of the base plate along the guiding slots of the positioning member, the guiding portions can guide the positioning portions of the positioning member to be connected to the positioning holes of the data accessing device. Meanwhile, the first fixing portion of the base plate is connected to the second fixing portion of the positioning member with the positioning member being tightly fixed to the data accessing device. As a result, the data accessing device is fixed to the housing of the electronic device.

9 Claims, 3 Drawing Sheets

FIXING MECHANISM

BACKGROUND OF THE INVENTION

1. Field of the Invention

The present invention relates generally to fixing mechanisms, and more particularly, to a fixing mechanism for fixing a data accessing device to a housing of an electronic device.

2. Description of Related Art

Conventionally, a data accessing device is fixed to a housing of an electronic device by rivets or screws. If having been fixed to the housing of the electronic device by the rivets, the data accessing device cannot be separated from the housing of the electronic device for further use. On the other hand, a user needs to use a screw driver to separated the data accessing device from the housing of the electronic if the data accessing device is fixed to the housing of the electronic device by the screws. Moreover, the screws gather rust easily, and will be difficult to be rotated not very long.

Therefore, there is a need to provide a fixing mechanism through which a data accessing device can be easily installed to or separated from a housing of an electronic device without the need of any tools.

SUMMARY OF THE INVENTION

Accordingly, an objective of the present invention is to provide a fixing mechanism, through which a data accessing device can be easily installed to or separated from a housing of an electronic device without the need of any tools.

Another objective of the present invention is to provide a fixing mechanism having a simple structure.

In order to attain the above and other objectives, the present invention proposes a fixing mechanism for fixing a data accessing device to a housing of an electronic device. The data accessing device has a plurality of positioning holes. The fixing mechanism includes a base plate and a positioning member.

The base plate is disposed on the housing, for the data accessing device to be mounted on. The base plate has a first fixing portion, a plurality of guiding portions and a baffle board disposed at a side of the base plate and opposite to the first fixing portion for stopping the data accessing device.

The positioning member has a plurality of positioning portions, a second fixing portion, a plurality of guiding slots corresponding in position to the guiding portions of the base plate, and an opening allowing the first fixing portion of the base plate to pass through. The guiding portions, when moving in the guiding slots of the positioning member, guide the positioning portions of the positioning member to be connected to the positioning holes of the data accessing device. Therefore, the first fixing portion of the base plate is fixed to the second fixing portion of the positioning member, the positioning member is securely fixed to the data accessing device, and the data accessing device is accordingly fixed to the housing of the electronic device.

The positioning member further includes a stopping portion formed at a side of the positioning member and opposite to the second fixing portion, for stopping the data accessing device from moving beyond the stopping portion at the time the data accessing device is fixed to the electronic device.

Therefore, according to the fixing mechanism of the present invention, the guiding portions of the base plate are moved along the guiding slots of the positioning member so as to guide the positioning portions of the positioning member to be connected to the positioning holes of the data accessing device. Thereafter, the first fixing portion and the second fixing portion are fixed together with the positioning member being tightly fixed to the data accessing device. As a result, the data accessing device is fixed to the housing of the electronic device. The fixing mechanism of the present invention has a simple structure. Through the fixing mechanism of the present invention, the data accessing device can easily be installed to or removed from the housing of the electronic device without the need of any tools, thereby solving the conventional problems of complicated installing and removing processes caused by the screw fixing method.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

Figure 1:
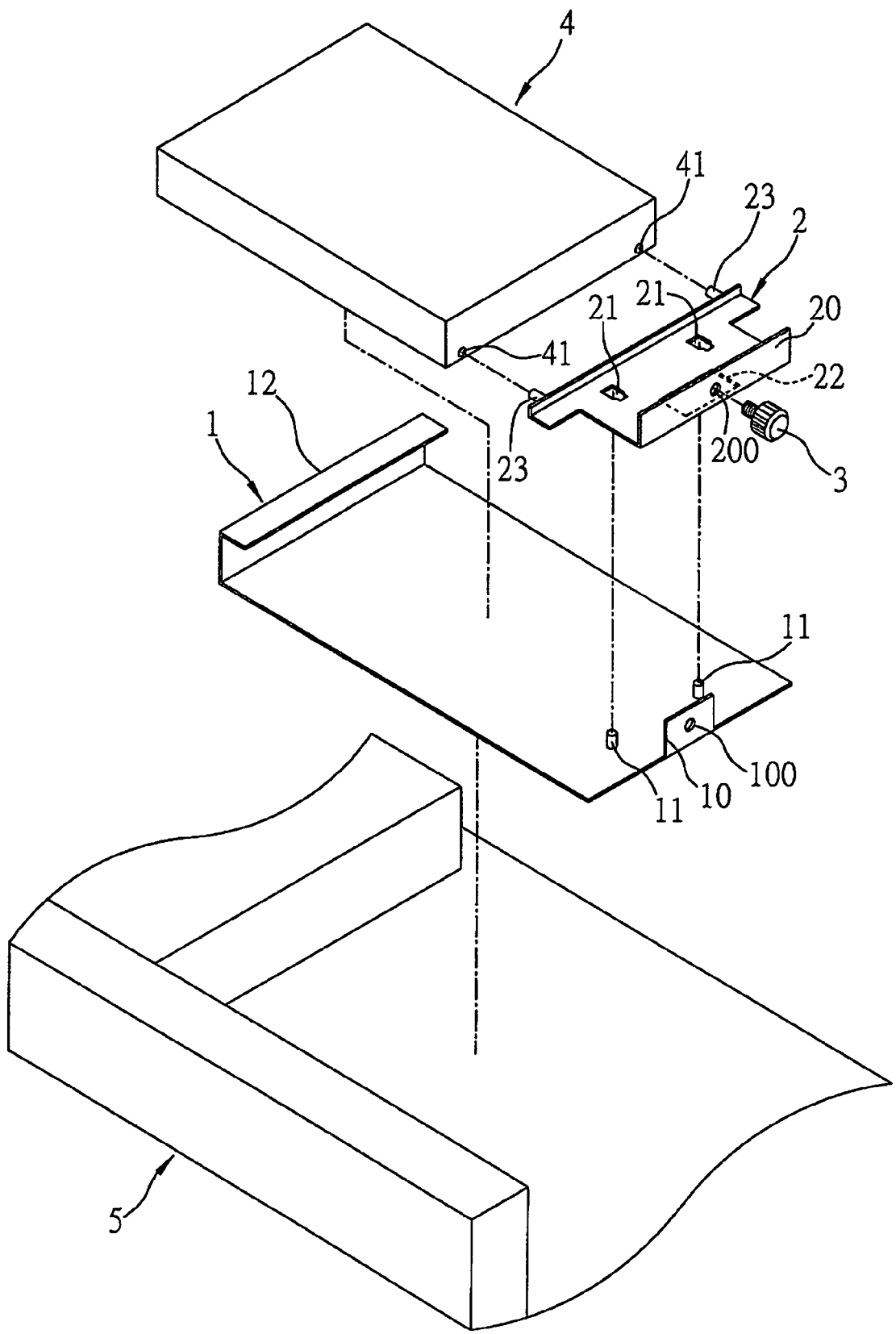
FIG. 1 is a structural diagram of a fixing mechanism of a first embodiment according to the present invention.
Figure 2:
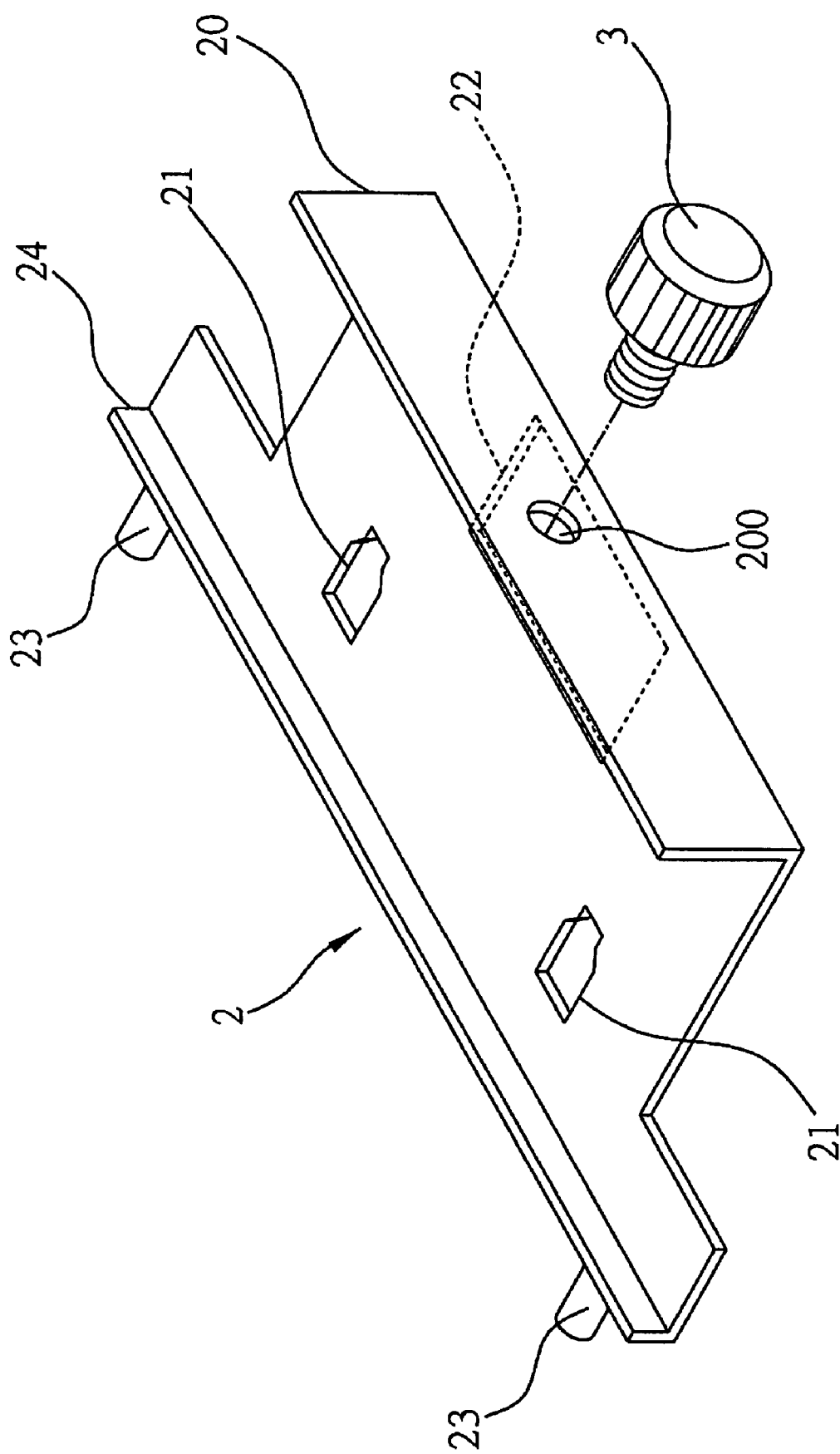
FIG. 2 is a structural diagram of a positioning member of the fixing mechanism shown in FIG. 1.

FIGS. 1 and 2 are two structural diagrams of a fixing mechanism of a first preferred embodiment according to the present invention. The fixing mechanism comprises a base plate 1 and a positioning member 2. The fixing mechanism is used for fixing a data accessing device 4 having a plurality of positioning holes 41 to a housing 5 of an electronic device. According to the first embodiment, both of the base plate 1 and the positioning member 2 can be made of plastic material, metal material or acrylic material.

The base plate 1 is disposed on the housing 5, and the data accessing device 4 is mounted on the base plate 1. The base plate 1 comprises a first fixing portion 10 and a plurality of guiding portions 11. The first fixing portion 10 is disposed on a first side 17 of the base plate 1. The base plate 1 further comprises a baffle board 12, which is disposed on a second side 18 and opposite to the fixing portion 10, for stopping the data accessing device 4. The baffle board 12 is a flat-shaped baffle board or an L-shaped baffle board.

The positioning member 2 comprises a second fixing portion 20, a plurality of guiding slots 21, an opening 22 and a plurality of positioning portions 23. The guiding slots 21 are disposed corresponding to the guiding portions 11 of the base plate 1. The opening 22 allows the first fixing portion 10 of the base plate 1 to pass through. The guiding portions 11, when moving in the guiding slots 21 of the positioning member 2, guide the positioning portions 23 of the positioning member 2 to be connected to the positioning holes 41 of the data accessing device 4. Therefore, the first fixing portion 10 of the base plate 1 can be fixed to the second fixing portion 20 of the positioning member 2, the positioning member 2 can be tightly fixed to the data accessing device 4, and the data accessing device 4 can be fixed to the housing 5 of the electronic device. The positioning member 2 further comprise a stopping portion 24 formed at a third side 27 and opposite to the second fixing portion 20, for stopping the data accessing device 4.

In the first embodiment, the first fixing portion 10 has a first fixing hole 100, and the second fixing portion 20 has a second fixing hole 200 corresponding to the first fixing hole 100. A locking member 3, by passing itself through the first fixing hole 100 and the second fixing hole 200, fixes the first fixing portion 10 to the second fixing portion 20. Therefore, the positioning member 2 is fixed to the data accessing device 4 tightly. The locking member 3 is a manual screw stub made of plastic material, metal material or acrylic material.

In a fixing process for fixing the data accessing device 4 to the housing 5 of the electronic device, the data accessing device 4 is disposed on the base plate 1 firstly, and the first fixing portion 10 of the base plate 1 then passes through the opening 22 of the positioning member 2, for allowing the guiding portions 11 of the base plate 1 to move in the guiding slots 21 and the positioning portions 23 of the positioning member 2 to be connected to the positioning holes 41 of the data accessing device 4. Thereafter, the first fixing hole 100 and the second fixing hole 200 are locked by the locking member 3. By adjusting the locking member 3, the positioning member 2 is fixed to the data accessing device 4 tightly, thereby fixing the data accessing device 4 to the housing 5. Through the present invention, the data accessing device 4 can be easily installed to or separated from the housing 5 of the electronic device without the need of any tools.

Figure 3:
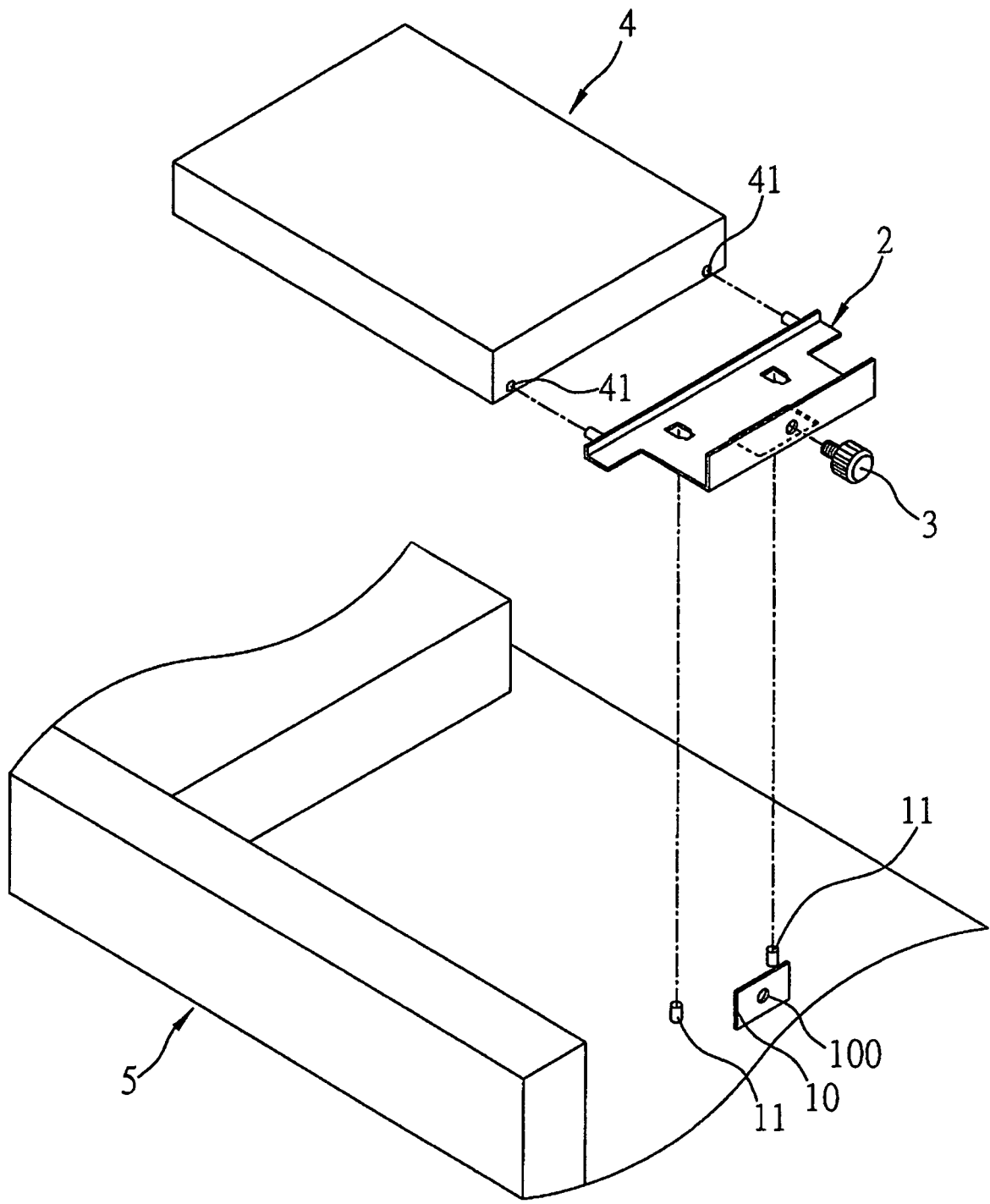
FIG. 3 is a structural diagram of a fixing mechanism of a second embodiment according to the present invention.

FIG. 3 is a structural diagram of a fixing mechanism of a second embodiment according to the present invention. The fixing mechanism of the second embodiment is similar to that of the first embodiment except that both the first fixing portion 10 and the guiding portions 11 of the fixing mechanism of the second embodiment are disposed on the housing 5 of the electronic device, rather than on the base plate 1 of the fixing mechanism of the first embodiment. In short, the base plate 1 is integrated with the housing 5 of the electronic device in the second embodiment, for reducing the fabrication cost and increasing productivity.

Therefore, according to the fixing mechanism of the present invention, the guiding portions of the base plate are moved along the guiding slots of the positioning member so as to guide the positioning portions of the positioning member to be connected to the positioning holes of the data accessing device. Thereafter, the first fixing portion and the second fixing portion are fixed together so as to fix the base plate and the positioning member together and meanwhile the positioning member is tightly fixed to the data accessing device. As a result, the data accessing device is fixed to the housing of the electronic device. The fixing mechanism of the present invention has a simple structure. Through the fixing mechanism of the present invention, the data accessing device can easily be installed to or removed from the housing of the electronic device without the need of any tools, thereby solving the conventional problems of complicated installing and removing processes caused by the screw fixing method.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fixing mechanism for fixing a data accessing device having a plurality of positioning holes to a housing of an electronic device, the fixing mechanism comprising:
   a base plate disposed on the housing for the data accessing device to be mounted on, the base plate having a first fixing portion and a plurality of guiding portions; and
   a positioning member having a plurality of positioning portions, a second fixing portion, a plurality of guiding slots corresponding in position to the guiding portions of the base plate, and an opening allowing the first fixing portion of the base plate to pass through, wherein the guiding portions, when moving in the guiding slots of the positioning member, are capable of guiding the positioning portions of the positioning member to be connected to the positioning holes of the data accessing device, such that the first fixing portion of the base plate is fixed to the second fixing portion of the positioning member, allowing the positioning member to be securely fixed to the data accessing device, and the data accessing device accordingly to be fixed to the housing of the electronic device.

2. The fixing mechanism of claim 1, wherein the positioning member further comprises a stopping portion formed at a side of the positioning member and opposite to the second fixing portion, for stopping the data accessing device from moving beyond the stopping portion at the time the data accessing device is fixed to the electronic device.

3. The fixing mechanism of claim 1, wherein the first fixing portion of the base plate comprises a first fixing hole, and the second fixing portion of the positioning member comprises a second fixing hole corresponding to the first fixing hole.

4. The fixing mechanism of claim 3, wherein the first fixing hole and the second fixing hole allow a locking member to pass through, such that the first fixing portion is fixed to the second fixing portion.

5. The fixing mechanism of claim 4, wherein the locking member is a manual screw stud.

6. The fixing mechanism of claim 4, wherein the locking member is made of one selected from the group consisting of a plastic material, a metal material and an acrylic material.

7. The fixing mechanism of claim 1, wherein the base plate further comprises a baffle board disposed at a side of the base plate and opposite to the first fixing portion, for stopping the data accessing device.

8. The fixing mechanism of claim 7, wherein the baffle board is one selected from the group consisting of a flat-shaped baffle board and an L-shaped baffle board.

9. The fixing mechanism of claim 1, wherein both the base plate and the positioning member are made of one selected from the group consisting of a plastic material, a metal material and an acrylic material.

* * * * *